United States Patent [19]

Nishiki et al.

[11] Patent Number: 4,571,494
[45] Date of Patent: Feb. 18, 1986

[54] MULTI-CHANNEL RADIATION DETECTOR ARRAY

[75] Inventors: Masayuki Nishiki; Toshihiro Rifu, both of Ootawara, Japan

[73] Assignee: Tokyo Shibaura Denki Kabushiki Kaisha, Kawasaki, Japan

[21] Appl. No.: 480,271

[22] Filed: Mar. 30, 1983

[30] Foreign Application Priority Data

Mar. 31, 1982 [JP] Japan .................................. 57-51363

[51] Int. Cl.$^4$ ................................................ G01T 1/24
[52] U.S. Cl. ....................................... 250/370; 250/385
[58] Field of Search ................. 250/370 G, 370 I, 385

[56] References Cited

U.S. PATENT DOCUMENTS

| | | | |
|---|---|---|---|
| 4,119,853 | 10/1978 | Shelley et al. | 250/385 |
| 4,210,805 | 7/1980 | Kobayashi et al. | 250/370 R |
| 4,417,144 | 11/1983 | Hoffman et al. | 250/370 G X |
| 4,476,390 | 10/1984 | Hanawa | 250/385 |

FOREIGN PATENT DOCUMENTS

| | | | |
|---|---|---|---|
| 120589 | 9/1979 | Japan | 250/370 G X |
| 142262 | 11/1980 | Japan | 250/370 I |

Primary Examiner—Alfred E. Smith
Assistant Examiner—Constantine Hannaher
Attorney, Agent, or Firm—Cushman, Darby and Cushman

[57] ABSTRACT

An X-ray detector has a plurality of detector units and a pair of support members. Each detector unit has a base plate, a detector element secured to the base plate, and a retaining plate supporting the detector element. The base plate has a signal line and a ground line for delivering an electrical signal from the detector element. The retaining plate is positioned parallel to the detector element. The support members are set apart and extend along an arc the center of which is an X-ray source. Each support member has a plurality of slits (grooves) cut in the face facing the other support member and juxtaposed at predetermined intervals along said arc. The end portions of each retaining plate are fitted in one slit of one of the support members and the corresponding slit of the other support member, respectively. Therefore, the detector units are supported by the support members and the detector elements are juxtaposed along said arc and set parallel to the X-ray beams from the X-ray source.

6 Claims, 5 Drawing Figures

MULTI-CHANNEL RADIATION DETECTOR ARRAY

BACKGROUND OF THE INVENTION

This invention relates to a radiation detector, and more particularly to an array type detector for a computerized tomography scanner.

Radiation such as X-rays or γ-rays is used in examination apparatus and measuring apparatus which are employed in medicine, engineering and other fields. To increase the accuracy of examination or measuring, an accurate detection of the dose of radiation is required. Particularly in X-ray computerized tomography (hereinafter abbreviated "CT"), it is necessary for an X-ray detector to accurately detect the intensity of X-rays passing through the living body.

More and more solid-state X-ray detectors are now used in place of gas type X-ray detectors. A gas type X-ray detector has a gaseous photoconductive medium, such as xenon gas, whose conductance varies according to the dose of X-rays passing through it, and so requires an envelope for containing such a gaseous photoconductive medium. The gas X-ray detector which is provided with such an envelope has a complicated structure. Moreover, its X-ray absorption efficiency is low. The X-ray absorption efficiency is influenced by the vibration of the detector and fluctuates by the vibration. By contrast, a solid-state X-ray detector with a semiconductor device is advantageous in several respects. First, it is small and simple. Second, its detector elements can be arranged at short intervals, thus forming a compact array. Third, it has a high X-ray absorption efficiency and can thus detect the dose of X-rays very accurately. Fourth, the relation between the dose of X-rays it receives and an electrical signal it produces is very linear. Fifth, the difference in photosensitivity between the detector elements is small.

Each of the detector elements must, however, be precisely positioned with respect to the incident X-rays. otherwise, the solid-state X-ray detector cannot detect the dose of X-rays accuratley enough to be effectively used in X-ray CT. More specifically, if the axis of each detector element which is a rectangular member is inclined to an incident X-ray, the X-ray will pass through the element along a longer path than otherwise and the element will generate more electron-hole pairs than otherwise, thus producing an erroneous electrical signal.

No solid-state X-ray detector hitherto known has detector elements which are so precisely positioned with respect to incident X-rays and which are so densely arranged as to be effectively employed in an X-ray CT scanner.

SUMMARY OF THE INVENTION

An object of the present invention is to provide a radiation detector whose detector elements are precisely positioned with respect to incident rays.

Another object of the invention is to provide a radiation detector with detector elements which are arranged at short intervals to provide high density information.

Still another object of the invention is to provide a radiation detector which is simple and which can detect a radiation dosage very accurately.

According to the present invention, a radiation detector is provided which comprises a pair of support members set apart in the direction perpendicular to incident radiation, and a plurality of detector units supported by the support members and juxtaposed along an arc the center of which is a radiation source. Each of the support members has a face facing the other support member and a plurality of slits (grooves) cut in the face and aligned with the slits of the other support member. Each of the detector units comprises a detector element for converting an amount of incident radiation to an electrical signal, a base plate fixed to the detector element and having a signal line and a ground line both electrically connected to the detector element, and a retaining member holding the detector element and having a pair of insertion portions. The insertion portions of each retaining member are located on a line perpendicular to incident radiation and are fitted in one slit of one of the support members and one slit of the other support member, respectively. The slits of either support member are juxtaposed at predetermined intervals along said arc and extend along the incident rays, respectively.

DETAILED DESCRIPTION OF THE PREFERRED EMBODIMENT

Figure 1:
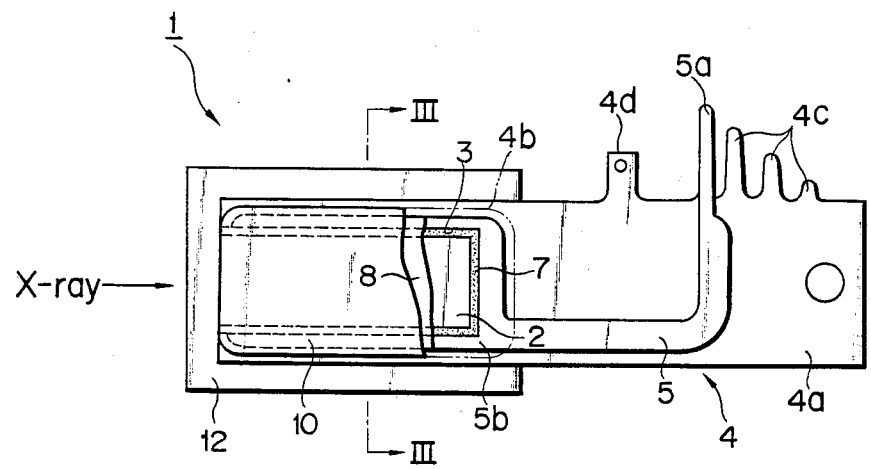
FIG. 1 is a side view of one of the detector units of a semiconductor radiation detector according to the present invention, showing one side of the detector unit.
Figure 2:
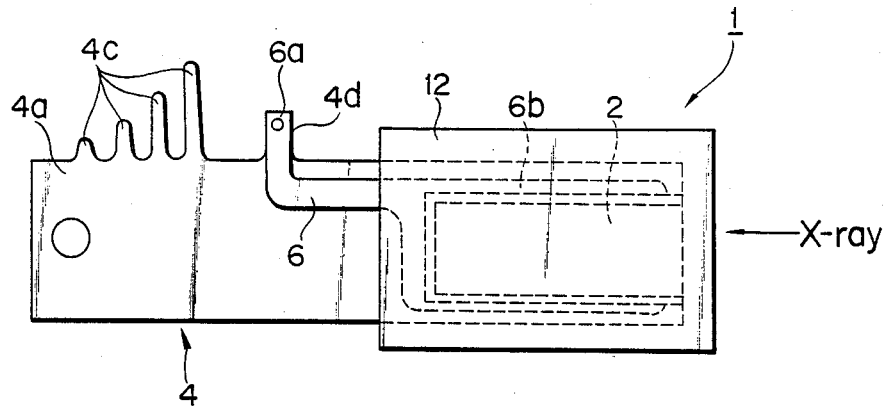
FIG. 2 is a side view of the detector unit, showing the other side of the unit.
Figure 3:
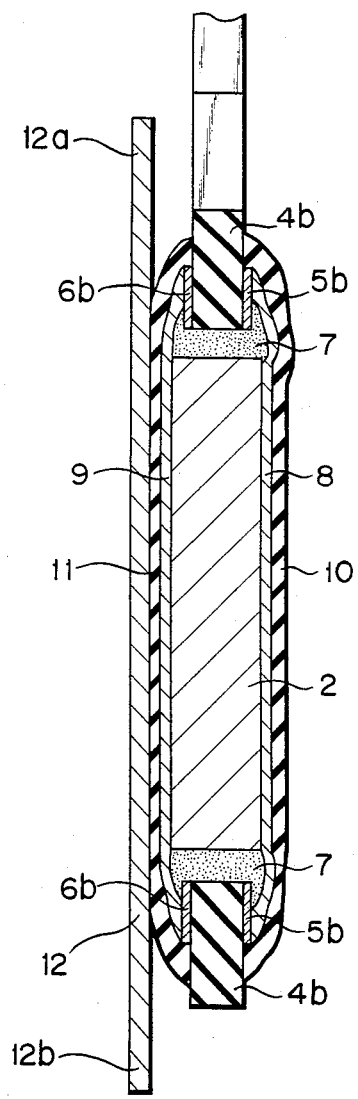
FIG. 3 is a sectional view taken along line III—III in FIG. 1.

FIGS. 1 to 3 shows one of the detector units 1 of a semiconductor radiation detector according to the present invention. The detector unit 1 comprises a semiconductor detector element 2, a base plate 4 and a retainer 12. The detector element 2 is a rectangular plate of 15 mm wide which has a flat surface. It is made of semiconductor material such as Si, Ge, CdTe, HgI$_2$ or GaAs. When it is made of single crystal silicon, the element 2 will be either or p-conductivity type or n-conductivity type, depending on the impurity doped in it.

The base plate 4 is a thin rectangular insulative plate made of fiber glass reinforced plastic (FRP) or the like. The base plate 4 has a connector portion 4a and a supporting portion 4b. The supporting portion 4b supports the semiconductors detection element 2. Four projections 4c and another projection 4d protrude from one edge of the connector portion 4a. The supporting portions 4b has a rectangular notch 3 which extends substantially to the middle portion of the plate 4 and which is a little larger than the semiconductor detector element 2. A signal line electrode 5 is formed on one surface of the base plate 4. It extends from one of the projections 4c and is branched into two portions which extend along the rectangular notch 3 as shown in FIG. 1. As shown in FIG. 2, a ground line electrode 6 which is shaped like the signal line electrode 5 is formed on the other surface of the base plate 4. The electrode 6 extends from the projection 4d and is branched into two portions which extend along the rectangular notch 3 as shown in FIG. 2. Both electrodes 5 and 6 are made of electrically conductive material and fomed by vapor-deposition, etching or another thin film forming technique.

The semiconductor detection element 2 is fitted in the notch 3 of the base plate 4. It is bonded to the base plate 4 with adhesive 7, such as an epoxy resin adhesive, which is applied in the gap between the element 2 and the base plate 4. The adhesive 7 must not be applied on either surface of the semiconductor detector element 2. Otherwise, the effective area of the element 2 from which electrical signals are supplied to the electrode layers 8 and 9 would be reduced and thereby lower the accuracy of X-ray dose detection.

One surface of the element 2 and the U-shaped portion 5b of the signal line electrode 5 are covered with an electrode layer 8 made of gold. The layer 8 is formed by, for instance, vapor-depositing gold on the element 2 and the U-shaped portion 5b of the electrode 5. The electrode layer 8 is electrically connected to the signal line electrode 5. A signal processing device (not shown) is connected to the connector portion 5a of the electrode 5 which is formed on the projection 4c. The electrode layer 8 which is formed on the detector element 2 is therefore electrically connected to the signal processing device through the electrode layer 8 which is formed on the U-shaped portion 5a and through the signal line electrode 5.

The other surface of the element 2 and the U-shaped portion 6b of the ground line electrode 6 are covered with an electrode layer 9 made of aluminum. The electrode layer 9 is formed by, for example, vapor-depositing aluminum of the element 2 and the U-shaped portion 6b of the electrode 6. The electrode layer 9 is electrically connected to the ground line electrode 6. The ground terminal of the signal processing device is connected to the connector portion 6a of the electrode 6 which is formed on the projection 4d. The electrode layer 9 which is formed on the U-shaped portion 6b as well as the detector element 2 is therefore electrically connected to the signal processing device.

As mentioned above, the electrode layer 8 and the electrode layer 9 are made of different metals, the former made of gold and the latter of aluminum. Therefore, a surface barrier is formed on one of the two major surfaces of the semiconductor detector element 2. A current signal can thus be supplied from the element 2 through the signal line electrode 5, without being biased. It is desired that both electrode layers 8 and 9 cover the entire major surfaces of the element 2, respecitvely. The larger the effective area from which electrical signals are supplied to the element 2 each electrode layer has, the higher the accuracy of the X-ray dose detection will become.

The semiconductor detector element 2 and the base plate 4 are secured to a retaining plate 12 with the electrode layer 9 sandwiched between the detector element 2 and the retaining plate 12. The retaining plate 12 is made of a rigid heavy metal such as tungsten or molybdenum, which can shield X-rays. The detector element 2 is connected to the retaining plate 12 by an adhesive 11 applied between the electrode layer 9 and the retaining plate 12. The element 2 and the plate 12 are so positioned that their opposing surfaces are parallel. The adhesive 11 is an electrically insulative one, such as an epoxy resin adhesive or a polyurethane resin adhesive. The adhesive 11 is applied on the entire surface of the electrode layer 9, thus forming an insulative layer. Similarly, an electrically insulative adhesive 10 is applied on the entire surface of the electrode layer 8, thus forming an insulative layer. Hence, the insulative layers electrically isolate both electrode layers 8 and 9 from the ambient atmosphere to protect the electrode layers 8 and 9.

The detector unit 1 is so positioned that an X-ray is incident on the detector element 2 in the direction of arrows shown in FIG. 1 and 2—that is, in the lengthwise direction of the base plate 4. FIG. 3 is a sectional view of the detector unit 1, taken along line III—III in FIG. 1.

Figure 4:
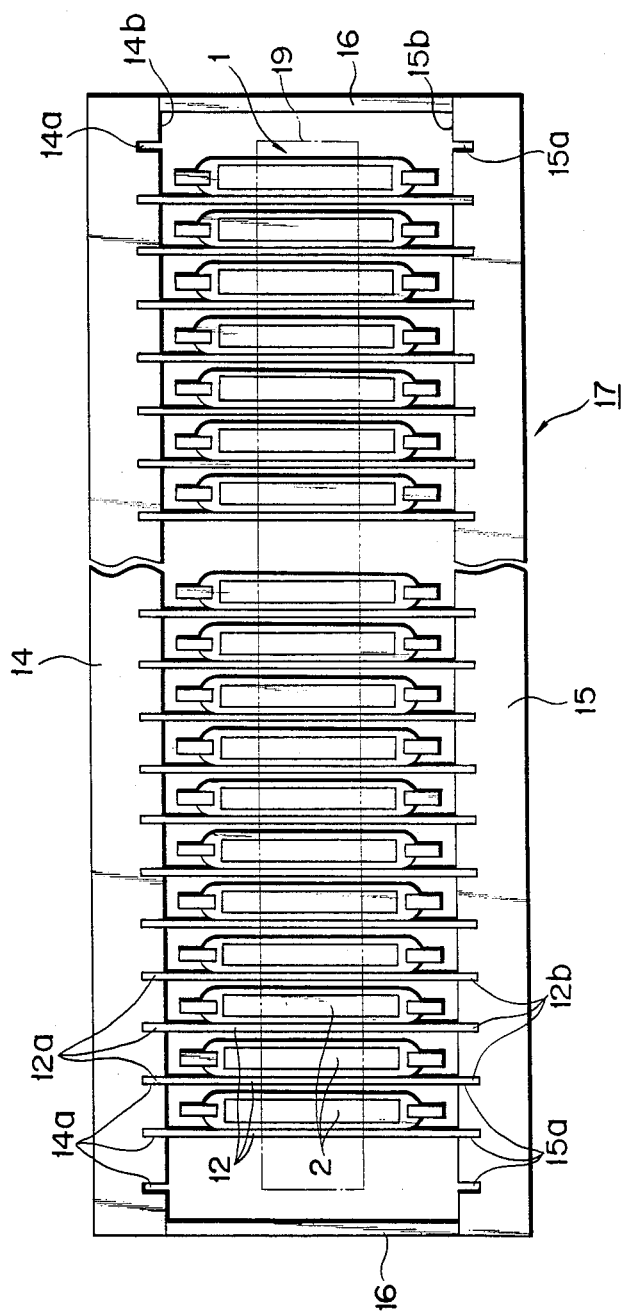
FIG. 4 is a side view of the semiconductor radiation detector as viewed from the X-ray source.
Figure 5:
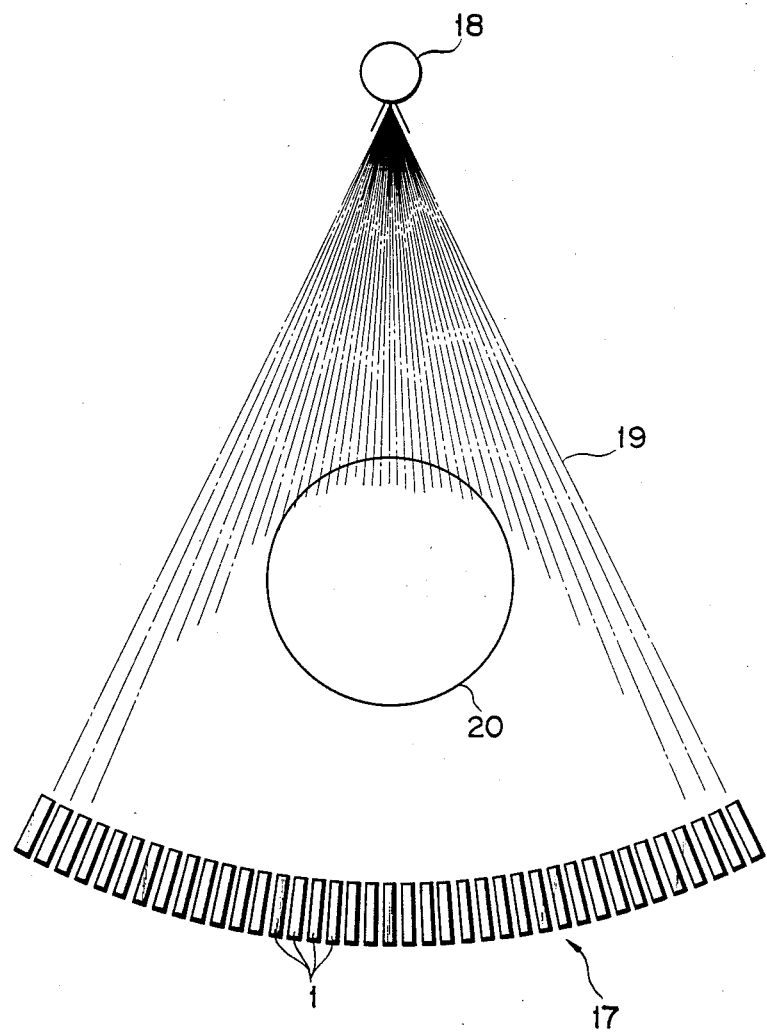
FIG. 5 is a plan view of the semiconductor radiation detector, illustrating the position of the detector with respect to the X-ray source of an X-ray CT scanner.

FIG. 4 shows an X-ray detector 17 comprising a plurality of such detector units 1 as shown in FIGS. 1-3. The detector units 1 are juxtaposed and form an array. As shown in FIG. 5, the array is arcuate, extending along an arc the center of which is the X-ray source 18 of an X-ray CT scanner. Each of the units 1 extends toward the X-ray source 18. FIG. 4 shows the front of the X-ray detector 17 as viewed from the X-ray source 18.

More specifically, as shown in FIG. 4, the detector units 1 are secured to a pair of parallel, arcuate support strips 14 and 15 which extend along said arc. Opposed surfaces 14b and 15b of the strips 14 and 15 are set apart for a distance longer than the width of the base plates 4 and a little shorter than the width of the retaining plates 12. They are connected at both ends to each other by two side strips 16. A plurality of slits 14a are cut in the surfaces 14b of the support strip 14 at regular intervals, and the same number of slits 15a are cut in the surfaces 15b of the support strip 15 at the same intervals. The slits 14a and 15a are as wide as the retaining plates 12 are thick. They extend in the directions of incident X-rays from the X-ray source 18. The slits 14a in the surface 14b of the support strip 14 are aligned in the direction normal to the surfaces 14b and 15b with the slits 15a in the surface 15b of the support strip 15, respectively. The retaining plates 12 each have both end portions 12a and 12b are fitted in the slit 14a and the slit 15a, respectively, whereby the detector units 1 are secured to the arcuate support strips 14 and 15.

Before the end portions 12a and 12b of each retaining plate 12 are fitted in the slits 14a and 15a, adhesive may be applied in the slits 14a and 15a. The detector unit 1 will then be more strongly secured to the support strips 14 and 15 than otherwise and will not rattle when the X-ray detector 17 is vibrated.

The X-ray source 18 emits X-ray fan-shaped beams 19 which extend in different directions in the same plane and which have a thickness of, for example, 10 mm. Since the slits 14a and 15a are parallel to these X-ray beams 19, the supporting plates 12 and thus detector elements 2 of the detector units 1 also extend parallel to the X-ray beams 19. Hence, X-ray beams 19 are incident on the respective detector elements 2 in the lengthwise directions thereof.

The connector portion 5a of the signal line electrode 5 of each detector unit 1 is connected to the signal processing device. The connector portion 6a of the ground line electrode 6 is also connected to the signal processing device. A patient 20 is positioned between the X-ray detector 17 and the X-ray source 18. X-ray beams 19 are emitted from the X-ray source 18. Some of the X-ray beams pass through the patient 20 and reach the X-ray detector 17, and the others are directly applied to the X-ray detector 17. The semiconductor detector elements 2 receive the X-ray beams 19. Currents which correspond to the doses of the X-rays incident on the respective elements 2 flow through the electrode layers 8 and 9 of the detector units 1. These currents are supplied to the signal processing device through the signal line electrode 5 and ground line electrodes 6 of the detector units 1. The dose of each X-ray beam 19 passing through the patient 20 and reaching the detector element 2 depends on which part of the patient 20 it passes through.

The electrical signals delivered from the detectro units 1 arranged in the form of an arcuate array are data representing the dose of X-rays passing through the patient 20. These data are stored in the signal processing device. Both the X-ray detector 17 and the X-ray source 18 are rotated around the patient 20 with the patient 20 forming an axis, while the X-ray source 18 is emitting X-ray beams 19. More data representing the dose of X-rays passing through the patient 20 are thus produced. The data thus produced are processed by the signal processing device, thereby forming a tomogram of the patient 20.

Each semiconductor detector element 2 is 0.4 to 1.5 mm thick. Each retaining plate 12 0.1 to 0.2 mm thick and sufficiently strong to support the detector element 2. Adhesive layers 10 and 11 are approximately 20 μm thick, and the intervals at which the detector units 1 are juxtaposed are as short as 0.5 to 1.7 mm. The X-ray beams 19 form a fan-shaped beam having a rectangular region which is 10 mm wide and about 500 mm long at the X-ray detector 17. When the detector units 1 are arranged at intervals of 1 mm, the X-ray detector 17 will provide 500 channel data. When the detector units 1 are juxtaposed at intervals of 0.5 mm, the X-ray detector 17 will provide 1000 channel data. The shorter the intervals at which the units 1 are arranged, the higher the resolution the tomogram will have.

The present invention is not limited to an X-ray detector. It can be applied to detectors for detecting other radiations such as γ-rays.

As described above, the support strips 14 and 15 each have a plurality of slits 14a and 15a which extend along the incident radiations, and the retaining plates 12 each have both end portions 12a and 12b fitted in the slits 14a and 15a, respectively. Each detector unit 1 is positioned so that its detector element 2 is aligned with an incident radiation. All the detector elements 2 can therefore be equally sensitive to radiations and can accurately detect the doses of the respective incident radiation. Thus, the detector accurately detects the dose of radiation applied to the patient 20. The detector elements 2 are a little wider than the thickness of the incident radiations reaching the detector 17. In order to maintain a desired accuracy of detection, the detector 17 needs to have a sufficiently large radiation receiving face. The detector elements 2 cannot therefore be made limitlessly thin.

If the elements 2 are each fitted at both ends in the slits 14a and 15a, respectively, the slits 14a and 15a must be as wide as the element 2 is thick. To juxtapose the elements 2 at short intervals in order to form a tomogram of a high resolution, the slits 14a must be cut at the same short intervals in the support strip 14 and the slits 15a must be so cut in the support strip 15. If wide slits are cut in either support strip at short intervals, the projections defining the slits will inevitably be too thin to hold the elements 2 immovable. In addition, it is difficult to cut such wide slits in the support strip 14 or 15. In brief, if the detector elements 2 are each fitted at both ends in the slits 14a and 15a, respectively, they cannot be juxtaposed at short enough intervals to form a tomogram of high resolution.

According to the present invention, the retaining plates 12, which are much thinner than the detector elements 2, each have both ends 12a and 12b fitted in the slits 14a and 15a, respectively. The slits 14a and 15a are as narrow as the retaining plates 12 are thin. The detector elements 2 can be juxtaposed at short intervals so as to form a tomogram of a high resolution. It is easy to cut narrow slits in the support strips 14 and 15. The gap between any two adjacent detector elements 2 can thus be reduced to the thickness of the retaining plate 12. Therefore, the detector elements 2 can be juxtaposed at such short intervals as mentioned above.

The present invention can thus provide a radiation detector which is small and light and which has a simple structure.

What we claim is:

1. A radiation detector comprising:
    a pair of support members set apart in a direction perpendicular to an incident radiation, each support member having a face facing the other support member and a plurality of grooves cut in the face, said grooves being juxtaposed at predetermined intervals along an arc, the center of which is a source of said radiation, extending along the incident rays of said radiation and aligned to the grooves of the other support member; and
    a plurality of detector units supported by the support members and juxtaposed along said arc, each of said detector units comprising:
    a base plate having a notch in a side thereof facing the radiation source;
    a plate-like detector element, fitted and secured in the notch of said base plate, for detecting the incident radiation rays, two major surfaces of said detector element being parallel with those of the base plate which is thinner than the detector element;
    two electrode layers formed on and electrically connected to the two major surfaces of said detector element, respectively;
    a retaining plate holding, by using an adhesive material, the detector element at one of the major surfaces thereof, the ends of said retaining plate being engaged in one of the grooves cut in one support member and in that groove cut in the other support member which is opposite to said groove; and
    two lead electrodes formed on and electrically connected to the major surfaces of said base plate, respectively.

2. A radiation detector according to claim 1, wherein said each electrode layers are made of different metals so that said detector element converts a radiation directly to an electrical signal without being biased.

3. A radiation detector according to claim 1, wherein each of the grooves of said support members has a width which is substantially equal to the thickness of said retaining plate, whereby the retaining plate is secured to said support members by fitting the end portions of the retaining plate in the corresponding grooves of said support members.

4. A radiation detector according to claim 3, wherein the end portions of said retaining plate are secured to said support members by an adhesive.

5. A radiation detector according to claim 4, wherein said retaining plate is made of a heavy metal which shields X-rays.

6. A radiation detector according to claim 1, wherein said detector element is made of a semiconductor material selected from the group consisting of Si, Ge, CdTe, $HgI_2$ and GaAs.

* * * * *